United States Patent
Aziz et al.

(10) Patent No.: US 7,756,235 B2
(45) Date of Patent: Jul. 13, 2010

(54) METHODS AND APPARATUS FOR DIGITAL COMPENSATION OF CLOCK ERRORS FOR A CLOCK AND DATA RECOVERY CIRCUIT

(75) Inventors: Pervez M. Aziz, Dallas, TX (US); Mohammad S. Mobin, Orefield, PA (US); Gregory W. Sheets, Breinigsville, PA (US)

(73) Assignee: Agere Systems Inc., Allentown, PA (US)

( * ) Notice: Subject to any disclaimer, the term of this patent is extended or adjusted under 35 U.S.C. 154(b) by 853 days.

(21) Appl. No.: 11/540,947

(22) Filed: Sep. 29, 2006

(65) Prior Publication Data

US 2008/0080657 A1  Apr. 3, 2008

(51) Int. Cl.
*H03D 3/24* (2006.01)
(52) U.S. Cl. ............. 375/373; 375/371; 375/375; 375/376; 327/147; 327/149; 327/153; 327/156; 327/158; 327/161
(58) Field of Classification Search ......... 375/371–376; 327/147–163
See application file for complete search history.

(56) References Cited

U.S. PATENT DOCUMENTS

| | | | |
|---|---|---|---|
| 7,330,508 B2* | 2/2008 | Momtaz | 375/233 |
| 7,486,748 B2* | 2/2009 | Mak et al. | 375/325 |
| 2004/0187043 A1* | 9/2004 | Swenson et al. | 713/400 |
| 2007/0096783 A1* | 5/2007 | de la Torre | 327/156 |

* cited by examiner

*Primary Examiner*—Curtis B Odom
(74) *Attorney, Agent, or Firm*—Ryan, Mason & Lewis, LLP (57) ABSTRACT

Methods and apparatus are provided for digital compensation of clock timing errors in a VCDL. Clock timing errors in a clock and data recovery system having a voltage controlled delay loop comprised of a plurality of delay elements are compensated for by evaluating a phase of data recovered from an input signal; generating one or more uncompensated clock phase adjustment values based on the phase evaluation; generating one or more compensation terms that compensate for a non-ideal delay for one or more of the delay elements; and determining an adjustment to one or more clock phases produced by the voltage controlled delay loop based on the uncompensated clock phase adjustment values and the one or more compensation terms. The one or more compensation terms can be subtracted from the uncompensated clock phase adjustment values to generate the adjustment to the one or more clock phases.

20 Claims, 11 Drawing Sheets

| DelCell# | ITap# | Tap# | $t_k$ | $t_k$ | $t_{k,id}$ | $t_e$ | $\Delta_k$ | $\Delta_{id}$ | $\Delta_e$ |
|---|---|---|---|---|---|---|---|---|---|
| 0 | 0 | 0 | $44 + 0(\frac{36}{8}) + 0$ | 44.0 | 40 | 4.0 | 0.0 | 5 | 0.0 |
| 0 | 1 | 1 | $44 + 1(\frac{36}{8}) + 1$ | 49.5 | 45 | 4.5 | 5.5 | 5 | 0.5 |
| 0 | 2 | 2 | $44 + 2(\frac{36}{8}) - 1$ | 52.0 | 50 | 2.0 | 2.5 | 5 | -2.5 |
| 0 | 3 | 3 | $44 + 3(\frac{36}{8}) + 1$ | 58.5 | 55 | 3.5 | 6.5 | 5 | 1.5 |
| 0 | 4 | 4 | $44 + 4(\frac{36}{8}) + 1$ | 63.0 | 60 | 3.0 | 4.5 | 5 | -0.5 |
| 0 | 5 | 5 | $44 + 5(\frac{36}{8}) + 1$ | 67.5 | 65 | 2.5 | 4.5 | 5 | -0.5 |
| 0 | 6 | 6 | $44 + 6(\frac{36}{8}) + 1$ | 72.0 | 70 | 2.0 | 4.5 | 5 | -0.5 |
| 0 | 7 | 7 | $44 + 7(\frac{36}{8}) - 1$ | 74.5 | 75 | -0.5 | 2.5 | 5 | -2.5 |
| 1 | 0 | 8 | $88 + 0(\frac{36}{8}) + 0$ | 88.0 | 80 | 8.0 | 13.5 | 5 | 8.5 |
| 1 | 1 | 9 | $88 + 1(\frac{36}{8}) + 1$ | 93.5 | 85 | 8.5 | 5.5 | 5 | 0.5 |
| 1 | 2 | 10 | $88 + 2(\frac{36}{8}) - 1$ | 96.0 | 90 | 6.0 | 2.5 | 5 | -2.5 |
| 1 | 3 | 11 | $88 + 3(\frac{36}{8}) + 1$ | 102.5 | 95 | 7.5 | 6.5 | 5 | 1.5 |
| 1 | 4 | 12 | $88 + 4(\frac{36}{8}) + 1$ | 107.0 | 100 | 7.0 | 4.5 | 5 | -0.5 |
| 1 | 5 | 13 | $88 + 5(\frac{36}{8}) + 1$ | 111.5 | 105 | 6.5 | 4.5 | 5 | -0.5 |
| 1 | 6 | 14 | $88 + 6(\frac{36}{8}) + 1$ | 116.0 | 110 | 6.0 | 4.5 | 5 | -0.5 |
| 1 | 7 | 15 | $88 + 7(\frac{36}{8}) - 1$ | 118.5 | 115 | 3.5 | 2.5 | 5 | -2.5 |
| 2 | 0 | 16 | $124 + 0(\frac{36}{8}) + 0$ | 124.0 | 120 | 4.0 | 5.5 | 5 | 0.5 |
| 2 | 1 | 17 | $124 + 1(\frac{36}{8}) + 1$ | 129.5 | 125 | 4.5 | 5.5 | 5 | 0.5 |
| 2 | 2 | 18 | $124 + 2(\frac{36}{8}) - 1$ | 132.0 | 130 | 2.0 | 2.5 | 5 | -2.5 |
| 2 | 3 | 19 | $124 + 3(\frac{36}{8}) + 1$ | 138.5 | 135 | 3.5 | 6.5 | 5 | 1.5 |
| 2 | 4 | 20 | $124 + 4(\frac{36}{8}) + 1$ | 143.0 | 140 | 3.0 | 4.5 | 5 | -0.5 |
| 2 | 5 | 21 | $124 + 5(\frac{36}{8}) + 1$ | 147.5 | 145 | 2.5 | 4.5 | 5 | -0.5 |
| 2 | 6 | 22 | $124 + 6(\frac{36}{8}) + 1$ | 152.0 | 150 | 2.0 | 4.5 | 5 | -0.5 |
| 2 | 7 | 23 | $124 + 7(\frac{36}{8}) - 1$ | 154.5 | 155 | -0.5 | 2.5 | 5 | -2.5 |

| DelCell# | ITap# | Tap# | $t_k$ | $t_k$ | $t_{k,id}$ | $t_e$ | $\Delta_k$ | $\Delta_{id}$ | $\Delta_e$ |
|---|---|---|---|---|---|---|---|---|---|
| 15 | 0 | 0 | $44 + 0(\frac{36}{8}) + 0$ | 44.0 | 40 | 4.0 | 0.0 | 5 | 0.0 |
| 15 | 1 | 1 | $44 + 1(\frac{36}{8}) + 1$ | 49.5 | 45 | 4.5 | 5.5 | 5 | 0.5 |
| 15 | 2 | 2 | $44 + 2(\frac{36}{8}) - 1$ | 52.0 | 50 | 2.0 | 2.5 | 5 | -2.5 |
| 15 | 3 | 3 | $44 + 3(\frac{36}{8}) + 1$ | 58.5 | 55 | 3.5 | 6.5 | 5 | 1.5 |
| 15 | 4 | 4 | $44 + 4(\frac{36}{8}) + 1$ | 63.0 | 60 | 3.0 | 4.5 | 5 | -0.5 |
| 15 | 5 | 5 | $44 + 5(\frac{36}{8}) + 1$ | 67.5 | 65 | 2.5 | 4.5 | 5 | -0.5 |
| 15 | 6 | 6 | $44 + 6(\frac{36}{8}) + 1$ | 72.0 | 70 | 2.0 | 4.5 | 5 | -0.5 |
| 15 | 7 | 7 | $44 + 7(\frac{36}{8}) - 1$ | 74.5 | 75 | -0.5 | 2.5 | 5 | -2.5 |
| 0 | 0 | 8 | $88 + 0(\frac{36}{8}) + 0$ | 88.0 | 80 | 8.0 | 13.5 | 5 | 8.5 |
| 0 | 1 | 9 | $88 + 1(\frac{36}{8}) + 1$ | 93.5 | 85 | 8.5 | 5.5 | 5 | 0.5 |
| 0 | 2 | 10 | $88 + 2(\frac{36}{8}) - 1$ | 96.0 | 90 | 6.0 | 2.5 | 5 | -2.5 |
| 0 | 3 | 11 | $88 + 3(\frac{36}{8}) + 1$ | 102.5 | 95 | 7.5 | 6.5 | 5 | 1.5 |
| 0 | 4 | 12 | $88 + 4(\frac{36}{8}) + 1$ | 107.0 | 100 | 7.0 | 4.5 | 5 | -0.5 |
| 0 | 5 | 13 | $88 + 5(\frac{36}{8}) + 1$ | 111.5 | 105 | 6.5 | 4.5 | 5 | -0.5 |
| 0 | 6 | 14 | $88 + 6(\frac{36}{8}) + 1$ | 116.0 | 110 | 6.0 | 4.5 | 5 | -0.5 |
| 0 | 7 | 15 | $88 + 7(\frac{36}{8}) - 1$ | 118.5 | 115 | 3.5 | 2.5 | 5 | -2.5 |
| 1 | 0 | 16 | $132 + 0(\frac{36}{8}) + 0$ | 132.0 | 120 | 12.0 | 13.5 | 5 | 8.5 |
| 1 | 1 | 17 | $132 + 1(\frac{36}{8}) + 1$ | 137.5 | 125 | 12.5 | 5.5 | 5 | 0.5 |
| 1 | 2 | 18 | $132 + 2(\frac{36}{8}) - 1$ | 140.0 | 130 | 10.0 | 2.5 | 5 | -2.5 |
| 1 | 3 | 19 | $132 + 3(\frac{36}{8}) + 1$ | 146.5 | 135 | 11.5 | 6.5 | 5 | 1.5 |
| 1 | 4 | 20 | $132 + 4(\frac{36}{8}) + 1$ | 151.0 | 140 | 11.0 | 4.5 | 5 | -0.5 |
| 1 | 5 | 21 | $132 + 5(\frac{36}{8}) + 1$ | 155.5 | 145 | 10.5 | 4.5 | 5 | -0.5 |
| 1 | 6 | 22 | $132 + 6(\frac{36}{8}) + 1$ | 160.0 | 150 | 10.0 | 4.5 | 5 | -0.5 |
| 1 | 7 | 23 | $132 + 7(\frac{36}{8}) - 1$ | 162.5 | 155 | 7.5 | 2.5 | 5 | -2.5 |

| DelCell# | ITap# | Tap# | $t_k$ | $t_k$ | $t_{k,id}$ | $t_e$ | $\Delta_k$ | $\Delta_{id}$ | $\Delta_e$ |
|---|---|---|---|---|---|---|---|---|---|
| 14 | 0 | 0 | $44 + 0(\frac{36}{8}) + 0$ | 44.0 | 40 | 4.0 | 0.0 | 5 | 0.0 |
| 14 | 1 | 1 | $44 + 1(\frac{36}{8}) + 1$ | 49.5 | 45 | 4.5 | 5.5 | 5 | 0.5 |
| 14 | 2 | 2 | $44 + 2(\frac{36}{8}) - 1$ | 52.0 | 50 | 2.0 | 2.5 | 5 | -2.5 |
| 14 | 3 | 3 | $44 + 3(\frac{36}{8}) + 1$ | 58.5 | 55 | 3.5 | 6.5 | 5 | 1.5 |
| 14 | 4 | 4 | $44 + 4(\frac{36}{8}) + 1$ | 63.0 | 60 | 3.0 | 4.5 | 5 | -0.5 |
| 14 | 5 | 5 | $44 + 5(\frac{36}{8}) + 1$ | 67.5 | 65 | 2.5 | 4.5 | 5 | -0.5 |
| 14 | 6 | 6 | $44 + 6(\frac{36}{8}) + 1$ | 72.0 | 70 | 2.0 | 4.5 | 5 | -0.5 |
| 14 | 7 | 7 | $44 + 7(\frac{36}{8}) - 1$ | 74.5 | 75 | -0.5 | 2.5 | 5 | -2.5 |
| 15 | 0 | 8 | $88 + 0(\frac{36}{8}) + 0$ | 88.0 | 80 | 8.0 | 13.5 | 5 | 8.5 |
| 15 | 1 | 9 | $88 + 1(\frac{36}{8}) + 1$ | 93.5 | 85 | 8.5 | 5.5 | 5 | 0.5 |
| 15 | 2 | 10 | $88 + 2(\frac{36}{8}) - 1$ | 96.0 | 90 | 6.0 | 2.5 | 5 | -2.5 |
| 15 | 3 | 11 | $88 + 3(\frac{36}{8}) + 1$ | 102.5 | 95 | 7.5 | 6.5 | 5 | 1.5 |
| 15 | 4 | 12 | $88 + 4(\frac{36}{8}) + 1$ | 107.0 | 100 | 7.0 | 4.5 | 5 | -0.5 |
| 15 | 5 | 13 | $88 + 5(\frac{36}{8}) + 1$ | 111.5 | 105 | 6.5 | 4.5 | 5 | -0.5 |
| 15 | 6 | 14 | $88 + 6(\frac{36}{8}) + 1$ | 116.0 | 110 | 6.0 | 4.5 | 5 | -0.5 |
| 15 | 7 | 15 | $88 + 7(\frac{36}{8}) - 1$ | 118.5 | 115 | 3.5 | 2.5 | 5 | -2.5 |
| 0 | 0 | 16 | $132 + 0(\frac{36}{8}) + 0$ | 132.0 | 120 | 12.0 | 13.5 | 5 | 8.5 |
| 0 | 1 | 17 | $132 + 1(\frac{36}{8}) + 1$ | 137.5 | 125 | 12.5 | 5.5 | 5 | 0.5 |
| 0 | 2 | 18 | $132 + 2(\frac{36}{8}) - 1$ | 140.0 | 130 | 10.0 | 2.5 | 5 | -2.5 |
| 0 | 3 | 19 | $132 + 3(\frac{36}{8}) + 1$ | 146.5 | 135 | 11.5 | 6.5 | 5 | 1.5 |
| 0 | 4 | 20 | $132 + 4(\frac{36}{8}) + 1$ | 151.0 | 140 | 11.0 | 4.5 | 5 | -0.5 |
| 0 | 5 | 21 | $132 + 5(\frac{36}{8}) + 1$ | 155.5 | 145 | 10.5 | 4.5 | 5 | -0.5 |
| 0 | 6 | 22 | $132 + 6(\frac{36}{8}) + 1$ | 160.0 | 150 | 10.0 | 4.5 | 5 | -0.5 |
| 0 | 7 | 23 | $132 + 7(\frac{36}{8}) - 1$ | 162.5 | 155 | 7.5 | 2.5 | 5 | -2.5 |

FIG. 12

METHODS AND APPARATUS FOR DIGITAL COMPENSATION OF CLOCK ERRORS FOR A CLOCK AND DATA RECOVERY CIRCUIT

FIELD OF THE INVENTION

The present invention relates generally to techniques for clock and data recovery, and more particularly, to techniques for compensating for clock errors in a Clock and Data Recovery (CDR) circuit.

BACKGROUND OF THE INVENTION

Digital communication receivers must sample an incoming waveform and then reliably detect the sampled data. Typically, a receiver includes a CDR system to recover the clock and data from an incoming data stream. The CDR system generates a clock signal having the same frequency and phase as the incoming signal, which is then used to sample the received signal and detect the transmitted data.

U.S. patent application Ser. No. 10/965,138, filed Oct. 14, 2004, entitled "Parallel Sampled Multi Stage Decimated Digital Loop Filter for Clock/Data Recovery," incorporated by reference herein, discloses a CDR architecture that uses an oversampled phase detector followed by a parallel sampled multi-stage decimated digital loop filter. The use of parallel sampled multi-stage decimated loop filtering significantly reduces the area and power required by previous analog loop filter based solutions. In addition, the circuit behavior of the digital loop filter can be verified against the architectural level behavior and the digital loop filter parameters are not subject to analog errors and process/voltage/temperature (PVT) variations.

An implementation of the disclosed architecture, however, makes use of an analog phase selection circuit (PSC) that is implemented as a voltage controlled delay line (VCDL). The digital loop filter calculates digital phase adjustments to be made to the various sampling clocks and the VCDL actually changes the phase of the sampling clocks. VCDL errors, however, can degrade the jitter tolerance performance.

In particular, the VCDL introduces static clock timing errors that cause non-uniform spacing of the clock phases. For example, if the desired clock phase resolution is T/32, where T is the baud period, then the 32 phases of the recovered clock are not equally spaced by T/32 for each adjacent phase. In addition, depending on the specifics of the CDR architecture, multiple recovered clocks may be necessary if the architecture uses parallel sampled data or phase detectors requiring oversampling, such as bang-bang phase detectors or their extensions.

A need therefore exists for methods and apparatus for digital compensation of these clock timing errors in the VCDL.

SUMMARY OF THE INVENTION

Generally, methods and apparatus are provided for digital compensation of clock timing errors in a VCDL. According to one aspect of the invention, clock timing errors in a clock and data recovery system having a voltage controlled delay loop comprised of a plurality of delay elements are compensated for by evaluating a phase of data recovered from an input signal; generating one or more uncompensated clock phase adjustment values based on the phase evaluation; generating one or more compensation terms that compensate for a non-ideal delay for one or more of the delay elements; and determining an adjustment to one or more clock phases produced by the voltage controlled delay loop based on the uncompensated clock phase adjustment values and the one or more compensation terms. The non-ideal delay can be determined, for example, based on one or more measured clock times.

The one or more compensation terms can be subtracted from the uncompensated clock phase adjustment values to generate the adjustment to the one or more clock phases. The adjustment to the one or more clock phases can adjust a phase of a reference clock in the voltage controlled delay loop to produce one or more recovered clocks.

In one exemplary implementation, the measured clock times are recorded in a table that indicates the measured clock times for the plurality of delay elements and for a plurality of interpolator tap settings for each of the delay elements. In a further variation, the measured clock times are recorded in a plurality of tables, with each of the tables associated with a different injection point in the voltage controlled delay loop.

A more complete understanding of the present invention, as well as further features and advantages of the present invention, will be obtained by reference to the following detailed description and drawings.

DETAILED DESCRIPTION

The present invention provides methods and apparatus for digital compensation of these clock timing errors in the VCDL. The present invention provides more accurate clock and data recovery, with a phase selection circuit. The phase selection circuit may be embodied, for example, as a VCDL that produces multiple phases of a reference clock. With conventional techniques, these phases may have errors and result in clocks without the desired delay or phase spacing. In this manner, the CDR performance is more immune to clock errors resulting from an imperfect phase selection circuit by digitally correcting for such clock errors in the CDR phase adjustments and updates. In one exemplary implementation, the clock errors are characterized offline, for example, during a trimming phase, and the characterization information is stored in memory.

VCDL Architecture and Error Model

Figure 1:
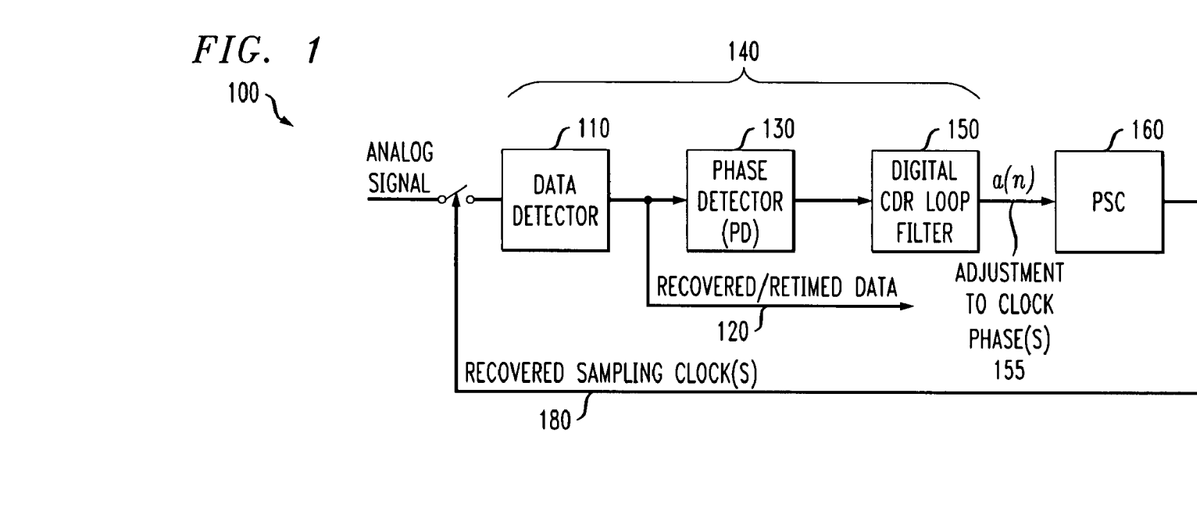
FIG. 1 is a block diagram of an exemplary CDR having a digital loop filter.

FIG. 1 is a block diagram of an exemplary CDR 100 having a digital loop filter 150. The CDR feedback loop 100 adjusts the phase and frequency of a nominal clock to produce one or more recovered clocks 180, that can sample the analog waveform to allow proper data detection 120. As shown in FIG. 1, the input analog signal is applied to a data detector 110, which may be embodied, for example, as a slicer (i.e., a decision device based on an amplitude threshold) or a more complicated detector, such as a sequence detector. The recovered/retimed data 120 is applied to a phase detector 130. A digital loop filter 150 processes the output of the phase detector 120 to generate clock phase adjustment values 155 that control a phase selection circuit (PSC) 160. The PSC 160 may be embodied, for example, as a VCDL that produces multiple phases of a reference clock, such as the VCDL 200, discussed further below in conjunction with FIG. 2. The PSC 160 continually adjusts the phase of the reference clock to effectively modify its phase and/or frequency to produce the recovered clock 180. The digital loop filter 150 may consist of one or more sub-filters. Stage 140 can optionally implement decimated or parallel sampled decimation.

Figure 2:
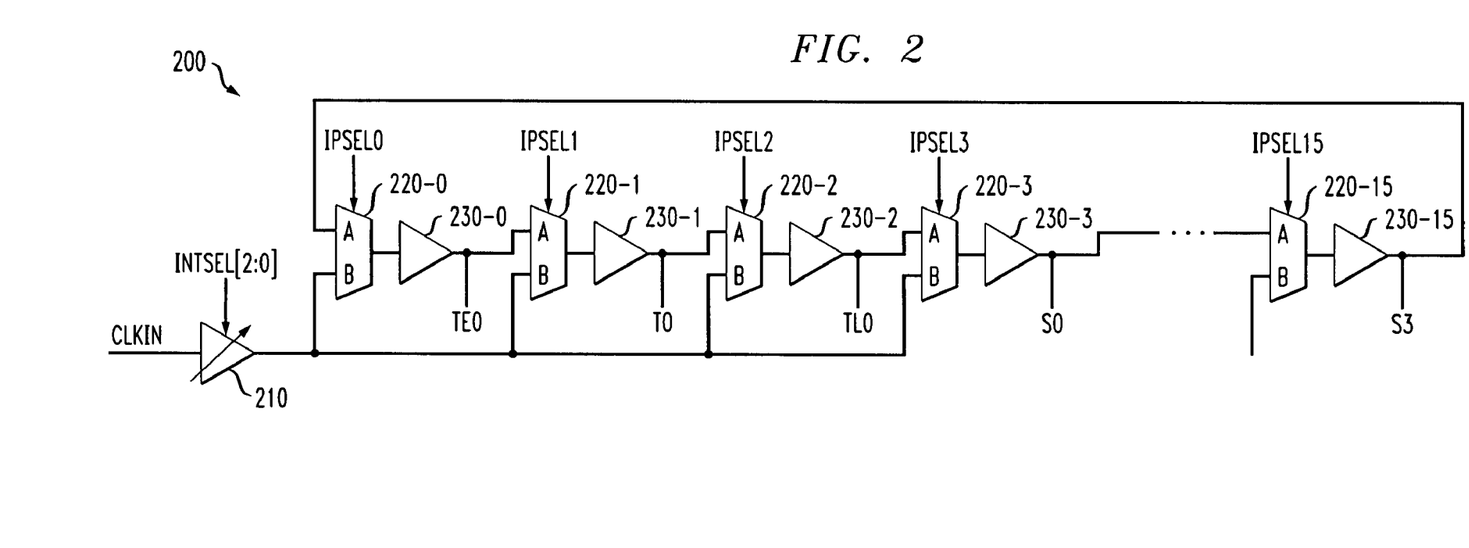
FIG. 2 is a block diagram of an exemplary VCDL architecture.

FIG. 2 is a block diagram of an exemplary VCDL architecture 200. As shown in FIG. 2, the exemplary VCDL 200 comprises 16 delay elements 230-0 through 230-15, across 4T, with each delay element 230 corresponding to an ideal delay of T/4. An input clock drives a central interpolator 210 that consists of a delay cell (not shown) followed by an interpolator (not shown) with 8 interpolation steps (based on a 3 bit value, INTSEL). The output of the interpolator 210 feeds selectable multiplexer injection points (IPs) 220-0 through 220-15 across the delay line 230. Each multiplexer 220-$i$ can be configured to select an A or B input, based on a corresponding selection signal, IPSEL$i$. Each A input is connected to the prior delay cell 230 in the chain. Each B input is connected to the output of the interpolator 210. Generally, only one multiplexer 220-$i$ has its B input selected at any given time.

In this manner, at any time, one delay cell 230-$i$ is the injection point and is selected to receive the interpolated clock (by having the associated multiplexer select the B input). All other delay cells 230 are driven by the clock provided by the prior delay cell (by having the associated multiplexer 220 select the A inputs). The T/4 delay cells 230 in conjunction with the 8 step interpolator 210 allows an overall phase resolution of T/32.

The DCDR phase adjustment generated by the digital loop filter 150 is appropriately translated to IPSEL0 . . . IPSEL15 and INTSEL[2:0] to provide the required change in sampling phase. In addition, sitting around the VCDL ring is a VCDL calibration loop (not shown) which imposes constraints on the sum of the delay cell delays.

In the example shown in FIG. 2, assume that each multiplexer 220-$i$ and delay cell 230-$i$ has an ideal delay of 40 picoseconds (ps). In addition, assume that the interpolator 210 has an ideal delay of 40 ps. Thus, the resolution of the exemplary interpolator 210 is 5 ps (40 ps/8 steps).

Figure 3:
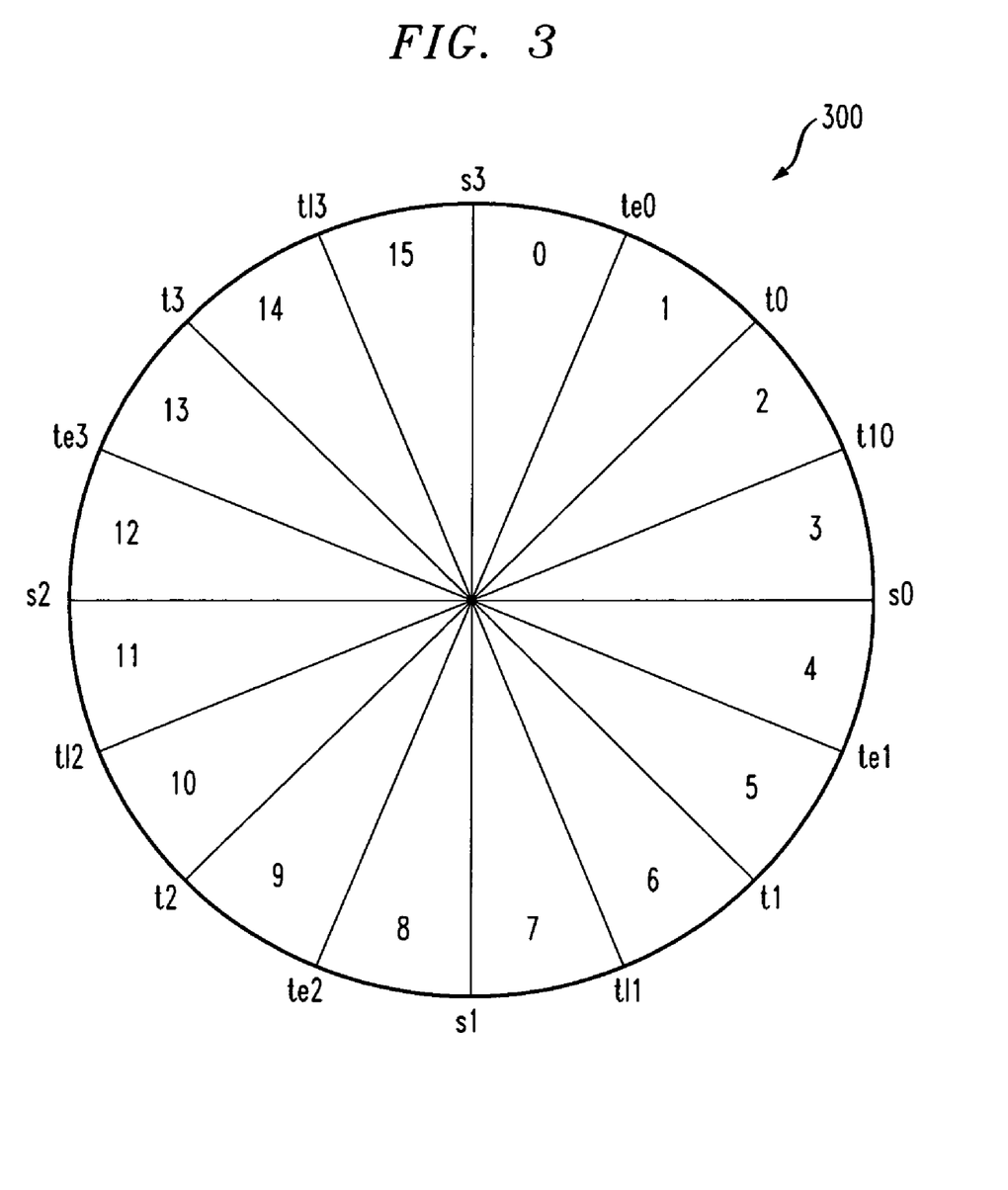
FIG. 3 shows a circular or pie representation of the VCDL of FIG. 2.

FIG. 3 shows a circular or pie representation 300 of the VCDL 200 of FIG. 2. As shown in FIG. 3, the output of each delay element (nominally separated by T/4) is labeled TE0, T0, TL0, S0, TE1, T1, TL1, S1, TE2, T2, TL2, S2, TE3, T3, TL3, S3 in FIGS. 2 and 3. In the exemplary embodiment, there are thus 16 clocks, separated by T/4. To obtain a desired value between two of the 16 available clocks, one of the 8 interpolator steps is selected. Assuming a baud rate of 160 ps, each delay element 230 has an ideal delay of 40 ps.

Residual VCDL Error Sources After Trimming

In a practical system, the VCDL delay elements 230 will undergo offline trimming and calibration of their values. However, as indicated above, there will be residual error. The present invention aims to digitally compensate for such errors. For the purpose of discussion and examples, the reference baud period or unit interval (UI) is assumed to be T equal to 160 ps for a 6.25 Gb/s data rate. In other words, T/4 equals 40 ps and T/32 equals 5 ps. As discussed hereinafter, there are three sources of error in the VCDL components, namely, due to the delay element errors, central interpolator delay cell error, and interpolator error. The errors in these components are denoted symbolically and exemplary typical values for these errors are provided.

Figure 4:
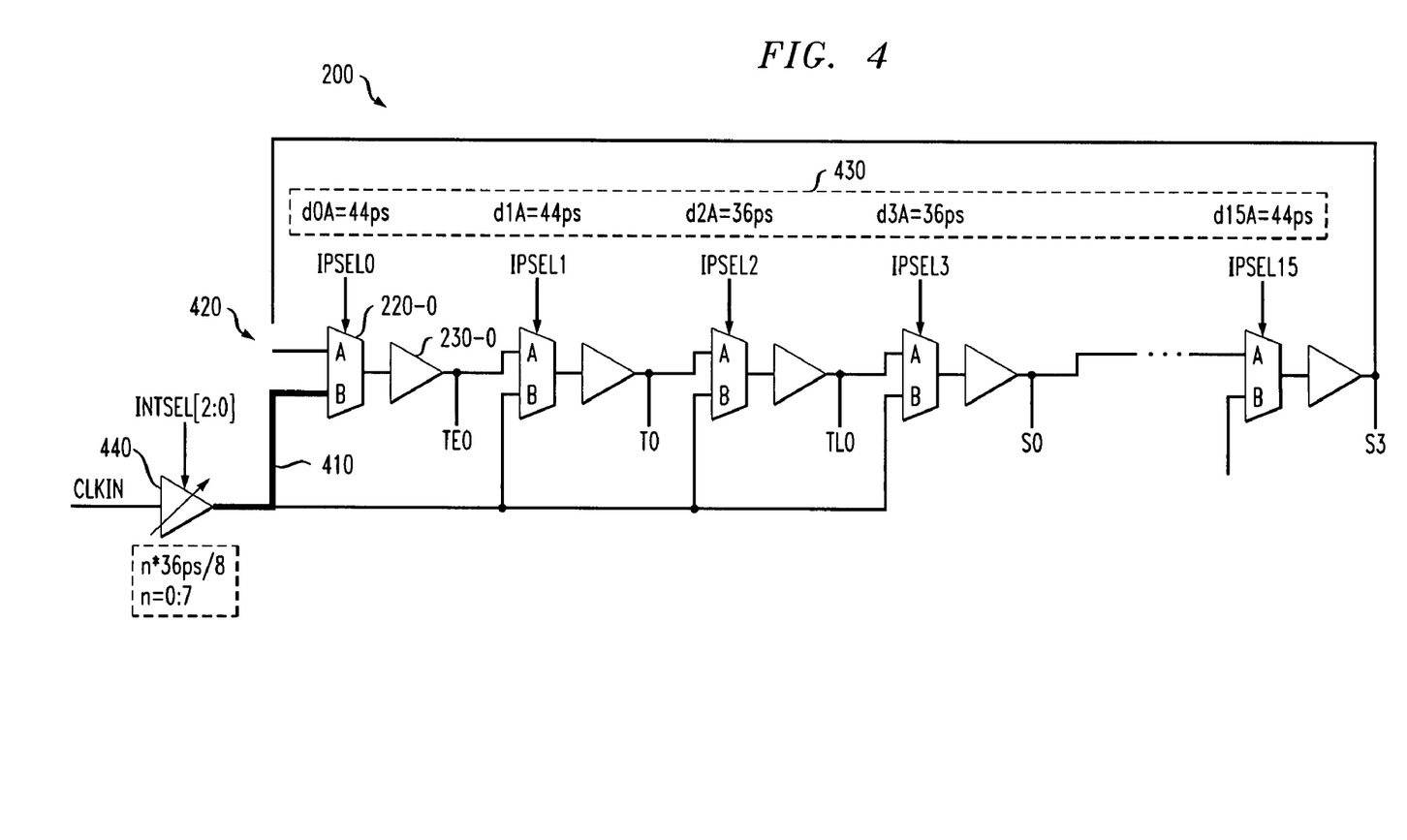
FIG. 4 is a block diagram of the exemplary VCDL architecture of FIG. 2 with delay cell 0 selected as the injection point.

FIG. 4 is a block diagram of the exemplary VCDL architecture 200 of FIG. 2 with delay cell 0 selected as the injection point. In the exemplary configuration shown in FIG. 4, the $0^{th}$ delay cell 230-0 is selected as the injection point by configuring the corresponding multiplexer 220-0 to select the B input (all other multiplexers select the A input). The corresponding elements of FIG. 4 perform in a similar manner to those discussed above in conjunction with FIG. 2. The selected multiplexer 220-0 is emphasized with the clock input 410 highlighted and a break 420 in the delay chain.

As discussed above, each multiplexer 220-$i$ and delay cell 230-$i$ was assumed to have an ideal delay of 40 picoseconds (ps) and the interpolator 210 was assumed to have an ideal delay of 40 ps. As discussed hereinafter in conjunction with FIG. 4, each delay element 230 in the delay chain has a non-ideal delay (shown in box 430) that will be addressed by the present invention. For example, the delays for the $0^{th}$ delay element 230-0 through the A path is 44 ps and through the B path is 36 ps. In addition, the delay element in the interpolator 210 has a non-ideal delay 440 of 36 ps.

Delay Cell Delay Error

The mth delay cell 230-$m$ has a delay cell step, $\hat{d}+d_e$, equal to the ideal step of the delay cell, $\hat{d}$, plus the delay cell step error, $d_e$. In other words, the mth delay cell 230-$m$ has a delay cell step of 40 ps±4 ps, for example.

It has been found that the delay cell is different for the two multiplexer paths A (previous input) or B (injection point). Consequently, the delay cell delay will be different depending on whether the cell is receiving the output of the previous delay or the injected clock, which is time varying. Let these different delays for the mth delay cell be $d_{mA}$ and $d_{mB}$.

As a simplification, it is assumed that $$\sum_{m=0}^{15} d_m = 640 \text{ps}.$$

Central Interpolator Delay Error

The central interpolator 210 has a delay step, $c_i=\hat{c}+c_e$. In other words, equal to the ideal step of the interpolator, plus the interpolator error (e.g., $\hat{c}=40$ ps, $c_e=\pm 4$ ps). The above error will show up to be the same in all delay cells.

Central Interpolator Error Due to Non-Linearity

The interpolation selection circuitry can also introduce errors. Thus, the interpolator error for $k^{th}$ tap or step, $i_{e,k}=+/-1$ ps, for example. The above error will show up to be the same in all delay cells.

Time Stamps, Time Deltas, and Delta Errors

Time Stamps

Time stamps are used to represent accumulated delays within the nominal 4T period of the VCDL ring 300. Starting with the delay cell 230-$i$ that is the injection point, i.e., the delay cell 230 into which the clock is injected, all the accumulated delays through the ring can be recorded and a table of such accumulated time stamps can be created. Since there can be 16 injection points in the exemplary embodiment, 16 tables can be employed, each corresponding to the 16 different delay cells being the injection point. The time stamps can be represented as follows:

Time stamp for $l^{th}$ tap within a delay cell (with respect to time at the beginning of the cell):

$$t_l = lc_i + i_{e,l}, l = 0 \ldots 7.$$

If the $n^{th}$ delay cell is the injection point $t_{n,m,l}$ i.e., the time for $l^{th}$ tap in $m^{th}$ delay cell will be:

$$t_{n,m,l} = d_{nB} + \sum_{j=n+1}^{(n+m-1)} d_{jA} + t_l.$$

where n+m−1 should be considered modulo 16.

Let k be an index into the entire delay table, i.e., k takes on values from 0 to 127. Each $t_{n,m,l}$ then corresponds to a $t_k$.

For purposes of discussion, it has been assumed that there are no delay mismatches between the A and B paths. Thus, $d_{nB} = d_{nA}$.

$t_{k,id}$=ideal time value at overall tap number k.
$t_e = t_k - t_{k,id}$=time error in table.

Time Deltas and Delta Errors

In addition to examining absolute time stamps, one can also consider looking at the time increments or deltas from one table entry to the next. These are then defined as follows:

$\Delta$=step size from one T/32 spaced tap to the next.
$\Delta_{id}$=ideal step size from one T/32 spaced tap to the next.
$\Delta_e = \Delta - \Delta_{id}$=error with respect to ideal delta.

Figure 5:
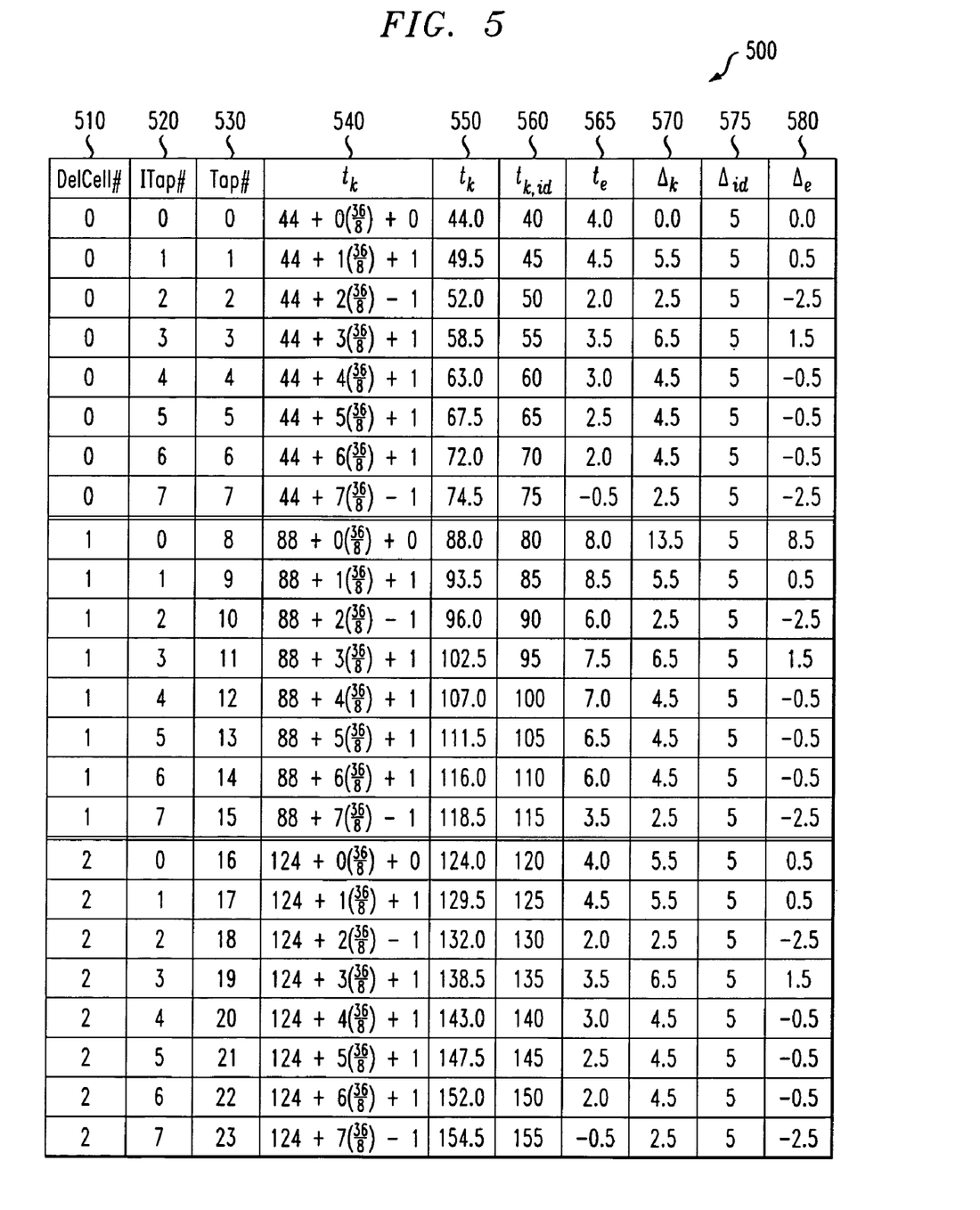
FIG. 5 is a sample table illustrating examples of time stamps through the first three delay cells when the injection point is at delay cell 0.

FIG. 5 is a sample table 500 illustrating examples of time stamps through the first three delay cells when the injection point is at delay cell 0. The numbers in the first column 510 show the delay cell across which the time stamps are shown. The second column 520 is the interpolation tap number. The third column 530 is the time index from 0 to 127 corresponding to the current time stamp for the total of 128 time indices which were present across 4T. Column 540 illustrates the time stamps for the paths, and columns 550 through 580 illustrate the various components of the time stamps, as discussed above. In the table 500 of FIG. 5, the first 24 indices are shown. As shown in box 430 of FIG. 4, the non-ideal values used for the delay elements are:

$d_{0A}$=44, $d_{1A}$=44, $d_{2A}$=36, $d_{3A}$=36, $d_{4A}$=44, $d_{14A}$=44, $d_{15A}$=44 and all other $d_{nA}$=40.

The central interpolator delay, $c_i$, is assumed to be 36 ps and the interpolation errors of [0, 1,−1, 1, 1, 1, 1,−1] ps are assumed to determine the deviations from the interpolation point for each of the 8 interpolation steps.

Figure 6A:
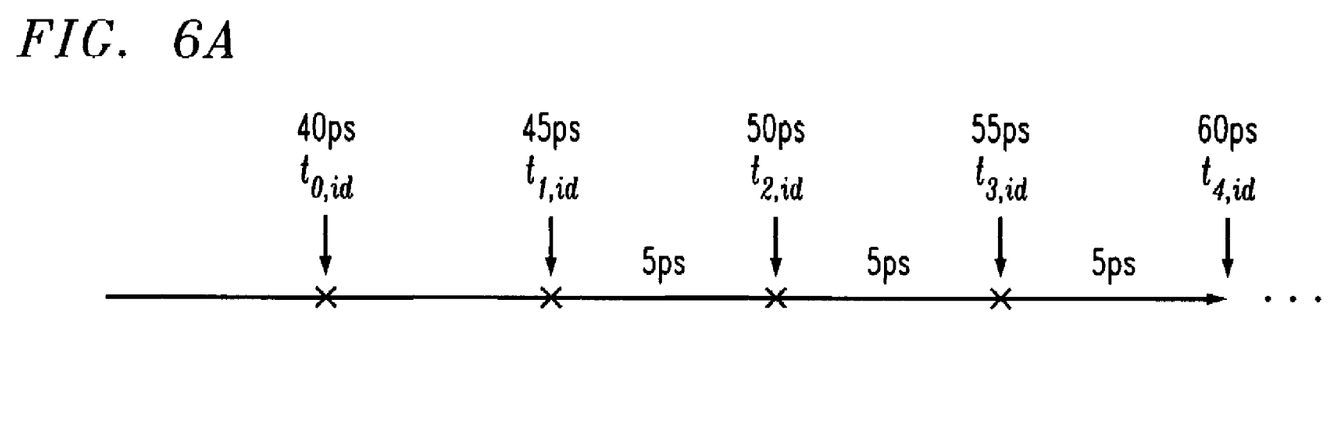
FIGS. 6A and 6B show pictorial diagrams of the clock phase/timing errors in FIG. 5 for a number of table entries.
Figure 6B:
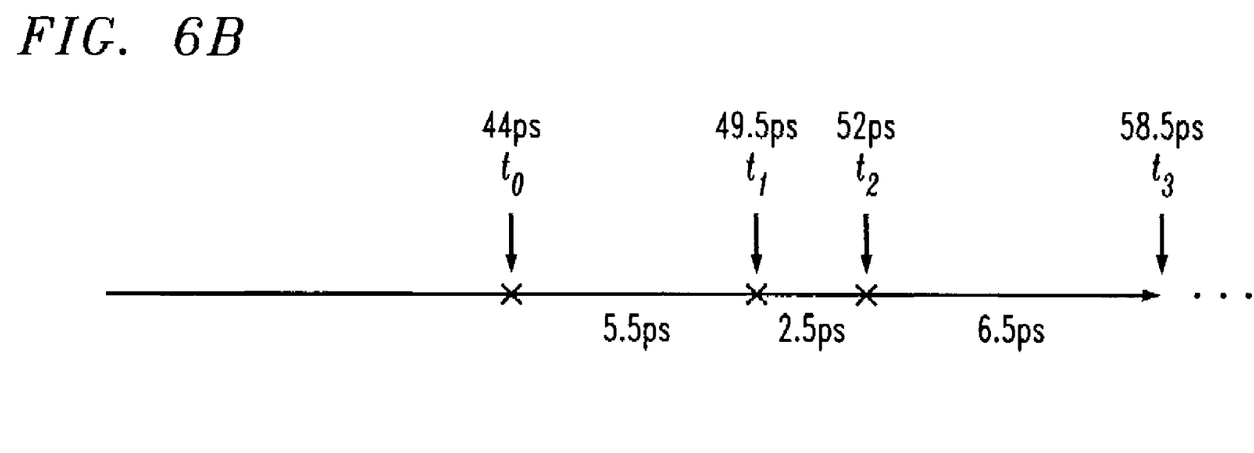

FIGS. 6A and 6B show pictorial diagrams of the clock phase/timing errors in FIG. 5 for the first few table entries, where the clock phase resolution is T/32 or (5 ps). FIG. 6A show the ideal clock phases for the first few table entries (column 560) with a clock phase resolution of T/32 or (5 ps). FIG. 6B show the non-ideal clock phases for the first few table entries (column 550) of FIG. 5.

When the injection point changes, the 4T update is compensated to reflect the modulo 4T nature of the VCDL 200, 300. For example, consider the initial state of the VCDL 200 as shown in FIG. 4 where the injection point is at the $0^{th}$ delay cell, i.e., ip=0. In this state, te0 is the output of the $0^{th}$ delay cell with 0 interpolation delay. As further adjustments call for more and more delay, the interpolation delay will increase until te0 is the output of the $0^{th}$ delay element and 7 interpolation delays. Upon further increase of the delay, the injection point is switched to delay cell 15 resulting in the configuration shown in FIG. 7.

Figure 7:
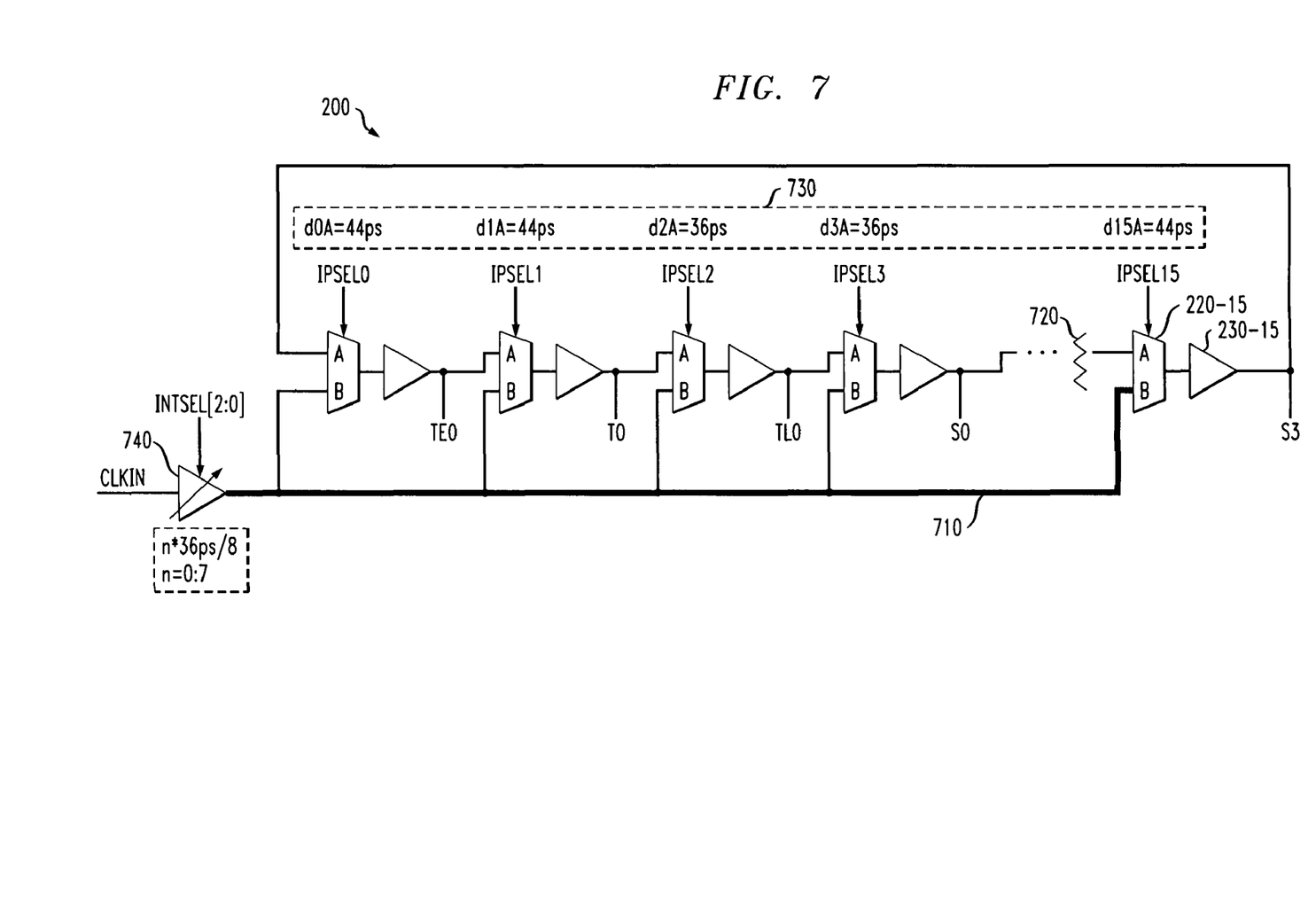
FIG. 7 is a block diagram of the exemplary VCDL architecture of FIG. 2 with delay cell 15 selected as the injection point.

FIG. 7 is a block diagram of the exemplary VCDL architecture 200 of FIG. 2 with delay cell 15 selected as the injection point. The corresponding elements of FIG. 7 perform in a similar manner to those discussed above in conjunction with FIG. 2. The selected multiplexer 220-15 is emphasized with the clock input 710 highlighted and a break 720 in the delay chain. Each delay element 230 in the delay chain has a non-ideal delay (shown in box 730) that will be addressed by the present invention. For example, the delays for the $15^{th}$ delay element 230-15 is 44 ps. In addition, the delay element in the interpolator 210 has a non-ideal delay 740 of 36 ps.

The timing error, te0, through cell 0 has a delay of two full delays from cell 15 and 0, as desired. Although it appears that s3 went from having a delay of 4T due to 16 delay cells to a delay of only 1 cell, the 4T delay occurs naturally as a result of the next 4T clock edge.

Figure 8:
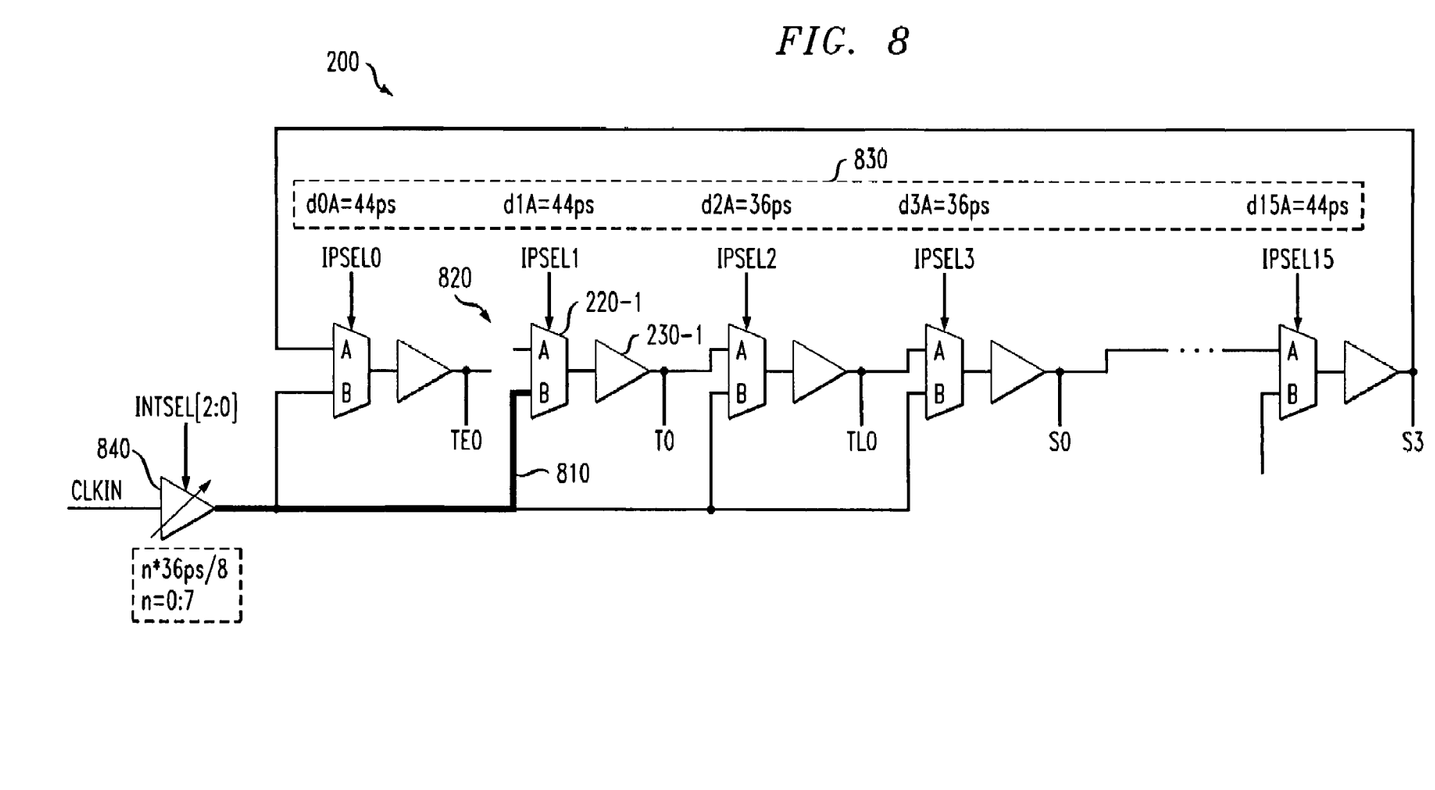
FIG. 8 is a block diagram of the exemplary VCDL architecture of FIG. 2 with delay cell 1 selected as the injection point.

FIG. 8 is a block diagram of the exemplary VCDL architecture 200 of FIG. 2 with delay cell 1 selected as the injection point. The corresponding elements of FIG. 8 perform in a similar manner to those discussed above in conjunction with FIG. 2. The selected multiplexer 220-1 is emphasized with the clock input 810 highlighted and a break 820 in the delay chain. Each delay element 230 in the delay chain has a non-ideal delay (shown in box 830) that will be addressed by the present invention. In addition, the delay element in the interpolator 210 has a non-ideal delay 840 of 36 ps.

Digital Clock Error Compensation

High Level Description and Assumptions

Figure 9:
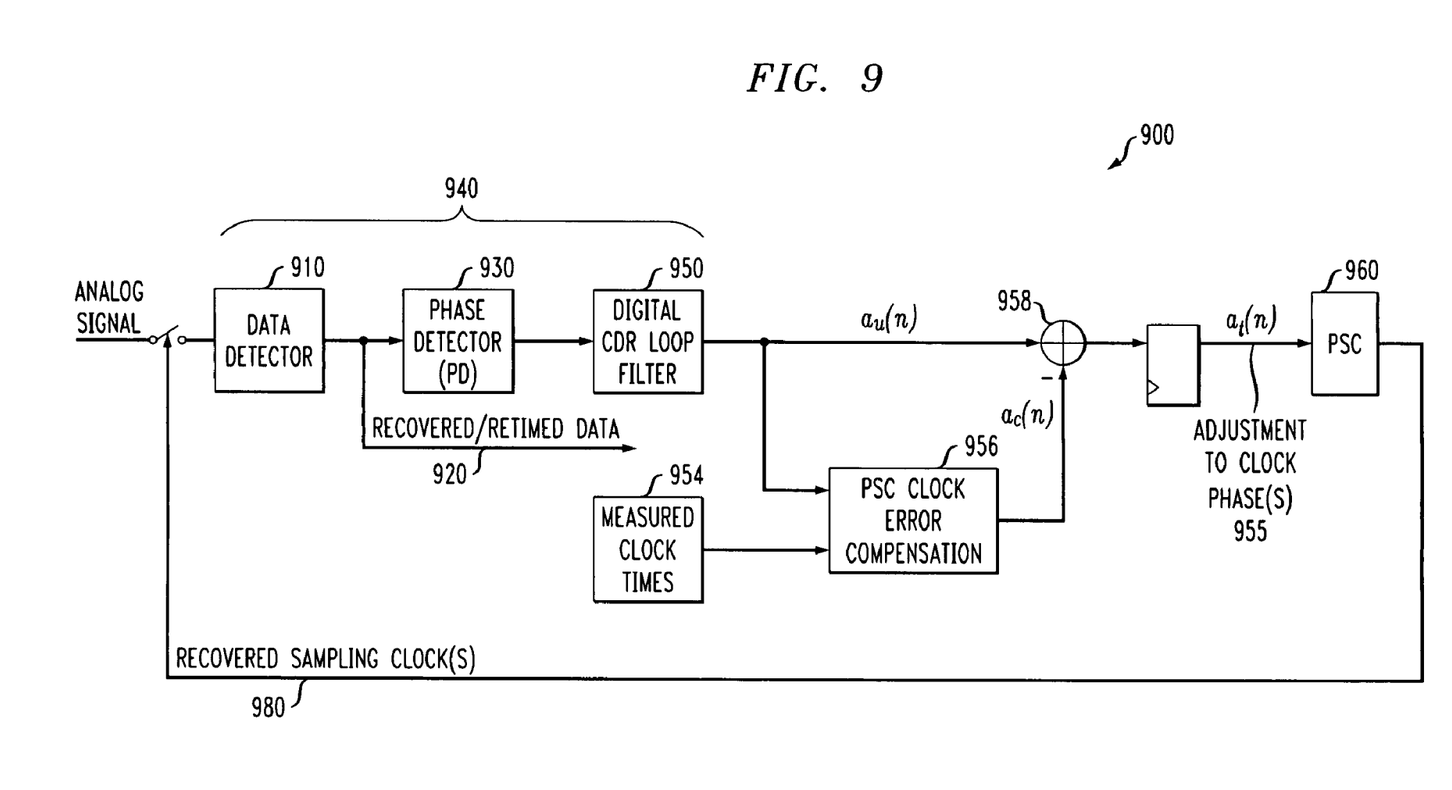
FIG. 9 is a block diagram of an exemplary CDR having a digital loop filter and digital compensation in accordance with the present invention.

FIG. 9 is a block diagram of an exemplary CDR 900 having a digital loop filter 950 and digital compensation in accordance with the present invention. The corresponding elements of FIG. 9 perform in a similar manner to those discussed above in conjunction with FIG. 1. The CDR feedback loop 900 adjusts the phase and frequency of a nominal clock to produce one or more recovered clocks 980, that can sample the analog waveform to allow proper data detection 920. As shown in FIG. 9, the input analog signal is applied to a data detector 910, which may be embodied, for example, as a slicer (i.e., a decision device based on an amplitude threshold) or a more complicated detector, such as a sequence detector. The recovered/retimed data 920 is applied to a phase detector 930. A digital loop filter 950 processes the output of the phase detector 920 to generate clock phase adjustment values 955 that control a phase selection circuit (PSC) 960. The PSC 960 continually adjusts the phase of the reference clock to effectively modify its phase and/or frequency to produce the recovered clock(s) 980. The digital loop filter 950 may consist of one or more sub-filters. Stage 940 can optionally implement decimated or parallel sampled decimation.

According to one aspect of the present invention, the CDR 900 employs digital compensation of the clock timing errors in the VCDL of the PSC 960. The digital loop filter 950 generates $a_u(n)$ values, which are the raw (uncompensated) adjustment values requested by the CDR. A PSC clock error compensation stage 956 generates compensation terms, $a_c$. An adder 958 sums the uncompensated adjustment values, $a_u(n)$, and the inverse of the compensation terms, $a_c$, to generate the compensated overall adjustment, $a_t$, as follows:

$$a_t(n) = a_u(n) - a_c(n). \quad (1)$$

The PSC clock error compensation stage 956 processes the current CDR stage from the digital loop filter 950 and accesses the measured clock times, for example, from an offline experiment, from a memory 954.

It is noted that the compensation terms, $a_c$, will be typically zero unless a large error is detected by the compensation block 956. The details of the compensation algorithm employed in stage 956 are described through an example with the following assumptions (for the sake of illustration):

Consider the case of a fixed frequency offset which is assumed to generate a continual stream of $a_u(n) = +1$, where the 1 represents a phase change of T/32.

As indicated above, path A and path B mismatches are initially ignored for ease of illustration. More complexity may be required for the final algorithm, in keeping track of the time stamps. It is assumed that the path A delay values are used for both path A and path B.

Assume no error in the clock time stamp measurement process to illustrate the example.

Consider what happens to the TE0 clock which at time 0 is at the output of the first delay element 230-0.

As the uncompensated adjustments, $a_u(n)$, continually arrive, the circle position can be tracked, and consequently the approximate timing error at any point in the circle can be determined. Whenever the positive timing error at a given point exceeds one adjustment (T/32) or 5 ps (for 6.25 Gb/s), compensate the timing error by setting $a_c(n) = -1$ once. So for a positive timing error, $$a_c(n) = \begin{cases} -1 & \text{if } t_k(n) - t_{k,idu}(n) > \dfrac{T}{32} \\ 0 & \text{otherwise} \end{cases} \quad (2)$$

Thus, there is no correction unless the timing error exceeds T/32.

The reverse would be true for a negative timing error. The timing error of the current time must be with respect to the ideal time based on the uncompensated adjustment stream as indicated by the use of $t_{k,idu}$ instead of $t_{k,id}$, as discussed further below.

Detailed Example

Consider an example compensation. At time 0, TE0 is the output of the 0th delay element. As seven sequential adjustments of $a_u = 1$ come in, the interpolator output is incremented accordingly until the 7th position is reached. Note from the table 500 in FIG. 5 that at this point, the actual time is $t_k = 74.5$ ps while $t_{k,id} = 75$ ps so the error is small. Throughout these 7 adjustments, the error remained below one step of 5 ps. Now, when another adjustment comes in, the injection point moves to the 15th delay element, and TE0 is still physically at the output of delay element 0. In terms of the table index, it is at index 8, but using the table for the injection point (IP) being at the input of delay element 15, shown in FIG. 10.

Figure 10:
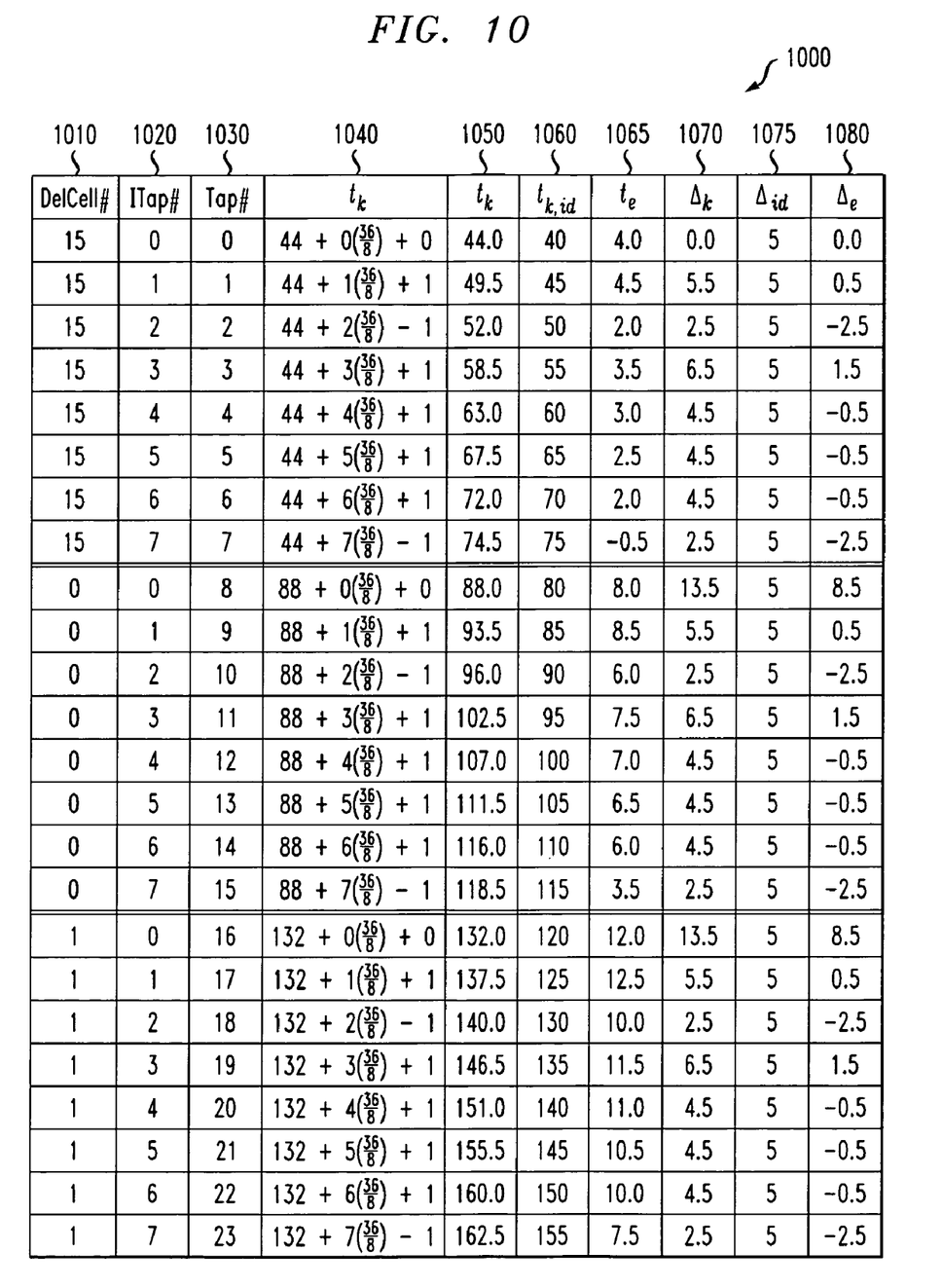
FIGS. 10 and 11 are sample tables illustrating examples of time stamps through the first three delay cells when the injection point is at delay cell 15 and delay cell 14, respectively.

FIG. 10 is a sample table 1000 illustrating examples of time stamps through the first three delay cells when the injection point is at delay cell 15. The column headings of FIG. 10 corresponding to those discussed above in conjunction with FIG. 5. At this $8^{th}$ index, $t_k = 88$ ps and $t_{k,id} = 80$ ps, so the error is 8 ps, as shown in FIG. 10, which calls for a correction with $a_c(n) = -1$, according to equation (2). This temporarily moves the injection point setting back to delay element 0, interpolator setting 7. Thus, the table 500 of FIG. 5 applies. The current time, $t_k$, is 74.5 ps, but the uncompensated ideal time is still 80 ps and not 75 ps, as shown in the table 500. The error is therefore −4.5 ps.

Now, suppose further adjustments $a_u(n) = 1$ come in. Again, the injection point settings are switched to delay element 15, so table 1000 of FIG. 10 applies. The current time is at table index 8 is 88 ps and the uncompensated ideal time $t_{k,id}$ is 85 ps. Thus, the error is −3 ps. If the metric of using the compensated ideal time was used (i.e., based on the current position, ignoring the history of the compensations), the error at this instance would remain 8 ps and, in fact, indicate to produce another compensation of $a_c(n) = -1$.

Figure 11:
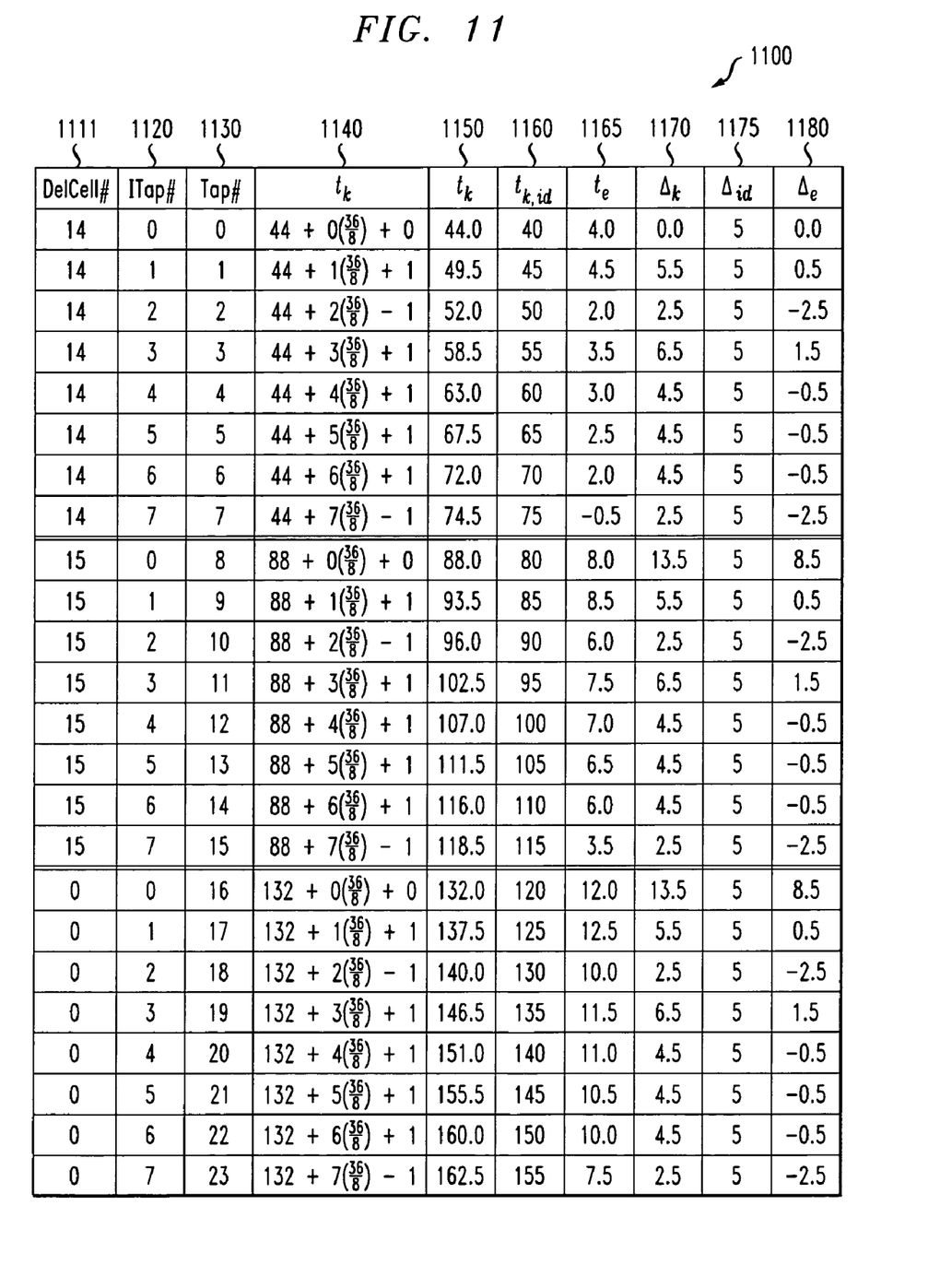

With further adjustments, the IP is eventually moved to delay element 14 and the TE0 will be at table index 16 when this happens, using the table for the IP being at delay element 14, shown in FIG. 11.

FIG. 11 is a sample table 1100 illustrating examples of time stamps through the first three delay cells when the injection point is at delay cell 14. The column headings of FIG. 11 corresponding to those discussed above in conjunction with FIG. 5.

At this time, the error is $t_k - t_{k,idu} = 132 - 125 = 7$ ps (not 132−120) ps. Another compensation is then initiated since the error exceeds 5 ps, which calls for a correction with $a_c = -1$ and the IP is moved back to delay element 15 (i.e., Table 1000 of FIG. 10). Thus, TE0 is at table index 16 in FIG. 10 with a time of 118.5 ps and uncompensated ideal time of 125 ps. The error is now −12.5 ps, so a positive compensation is initiated for $a_c = +1$ to return to the IP of delay element 14 with a time of 132 ps and ideal uncompensated time of 130 ps. The error is now 2.0 ps, so no other compensation is required.

Compensation Calculation

Figure 12:
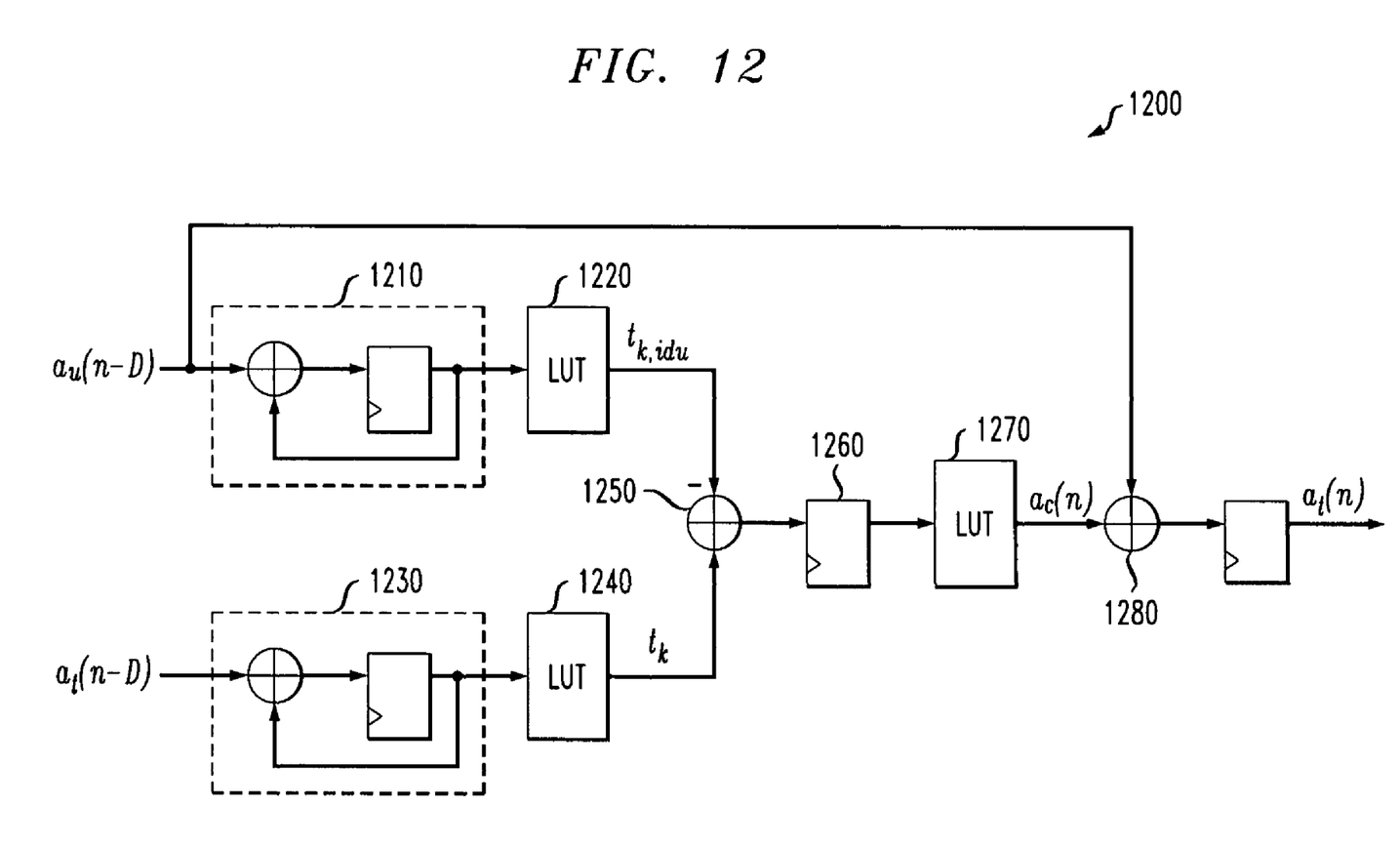
FIG. 12 is a block diagram of a compensation calculation circuit incorporating features of the present invention.

FIG. 12 is a block diagram of a compensation calculation circuit 1200 incorporating features of the present invention, in accordance with Equation (2). As shown in FIG. 12, the uncompensated adjustments are accumulated to obtain the uncompensated ideal time via accumulation of the uncompensation adjustments by an accumulator 1210 and subsequent look up table (LUT) 1220 operation. Likewise, the total adjustments are accumulated by an accumulator 1230 to determine the actual time via another LUT 1240. The ideal uncompensated time and actual time are subtracted by an adder 1250 and the logic operation needed to determine if it exceeds our exemplary 5 ps or not is represented by another latch 1260 and LUT 1270. The output of the LUT 1270 produces the compensation term $a_c(n)$ which when added to the uncompensated adjustment $a_u(n)$ by an adder 1280 produces the total adjustment $a_t(n)$.

It is noted that to have a causal system, the total adjustment stream must be delayed by some amount of D to reflect computation latency before it can be used to determine the current time. The uncompensated stream is likewise delayed by the same amount to maintain time alignment.

The adjustment history should be accumulated and conditions the determinations of the timing error. Uncompensated ideal times and actual times will grow without bound whereas the accumulators must be of finite arithmetic width for implementation. This can be handled by an arithmetic normalization technique (not shown). When both $t_k$ and $t_{k,idu}$ exceed a certain threshold, both can have a threshold subtracted from the accumulator values. A logical choice for this threshold is 4T or 640 ps representing the total time around the 4T delay ring.

Compensation Reference Point

In the above example and discussion, the compensation has been determined using the TE0 outputs as a reference point with which to determine the compensation. At the expense of more complexity, one might consider using additional reference points and compute some kind of average compensation based on these additional reference points.

On the Fly Table Update

Thus far, it has been assumed that the VCDL errors are characterized offline and as much of the error is trimmed as possible. The digital compensation compensates for any residual error. The trimming process, however, burns significant power. Any changes in process/voltage/temperature (PVT) which may change the delay cell errors would require continual re-trimming and thus extra power. It may be possible to merely characterize the errors without actually trimming the VCDL. In this manner, the entire amount of the VCDL error is compensated through the digital compensation. The power burned by the device would be less if the device was not re-trimmed. The compensation look up table would be updated on-the-fly. Note that on-the-fly characterization and look up table update should not be interpreted as "real time" (i.e., the characterization and look up table update need not proceed at the full data path speed based on every sample passing through the data path).

The present invention thus provides an algorithm for performing digital compensation of clock errors for a CDR. The clock error compensation makes the CDR performance less immune to clock errors in the phase selection circuit/ VCDL. The potential yield of the devices may be higher allowing devices with larger errors to provide acceptable performance. It may be possible to perform a on the fly update of the clock error look up table.

While exemplary embodiments of the present invention have been described with respect to digital logic blocks, as would be apparent to one skilled in the art, various functions may be implemented in the digital domain as processing steps in a software program, in hardware by circuit elements or state machines, or in combination of both software and hardware. Such software may be employed in, for example, a digital signal processor, micro-controller, or general-purpose computer. Such hardware and software may be embodied within circuits implemented within an integrated circuit.

Thus, the functions of the present invention can be embodied in the form of methods and apparatuses for practicing those methods. One or more aspects of the present invention can be embodied in the form of program code, for example, whether stored in a storage medium, loaded into and/or executed by a machine, or transmitted over some transmission medium, wherein, when the program code is loaded into and executed by a machine, such as a computer, the machine becomes an apparatus for practicing the invention. When implemented on a general-purpose processor, the program code segments combine with the processor to provide a device that operates analogously to specific logic circuits.

It is to be understood that the embodiments and variations shown and described herein are merely illustrative of the principles of this invention and that various modifications may be implemented by those skilled in the art without departing from the scope and spirit of the invention.

We claim:

1. A method for compensating for clock timing errors in a clock and data recovery system having a voltage controlled delay loop comprised of a plurality of delay elements, comprising:
   evaluating a phase of data recovered from an input signal;
   generating one or more uncompensated clock phase adjustment values based on said phase evaluation;
   generating one or more compensation terms that compensate for a non- ideal delay for one or more of said delay elements; and
   determining an adjustment to one or more clock phases produced by said voltage controlled delay loop based on said uncompensated clock phase adjustment values and said one or more compensation terms.

2. The method of claim 1, wherein said non-ideal delay is determined from one or more measured clock times.

3. The method of claim 2, wherein said measured clock times are recorded in a table.

4. The method of claim 3, wherein said table indicates said measured clock times for said plurality of delay elements and for a plurality of interpolator tap settings for each of said delay elements.

5. The method of claim 2, wherein said measured clock times are recorded in a plurality of tables, each of said tables associated with a different injection point in said voltage controlled delay loop.

6. The method of claim 1, wherein said one or more compensation terms are subtracted from said uncompensated clock phase adjustment values to generate said adjustment to said one or more clock phases.

7. The method of claim 1, wherein said adjustment to said one or more clock phases adjusts a phase of a reference clock in said voltage controlled delay loop to produce one or more recovered clocks.

8. The method of claim 1, wherein one of said compensation terms is set to a predefined value when a timing error at a given point exceeds a predefined threshold.

9. A clock and data recovery system having a voltage controlled delay loop comprised of a plurality of delay elements, comprising:
   a phase detector configured to evaluate a phase of data recovered from an input signal;
   a digital loop filter configured to generate one or more uncompensated clock phase adjustment values based on said phase evaluation;
   a clock error compensation circuit configured to generate one or more compensation terms that compensate for a non-ideal delay for one or more of said delay elements; and
   a phase selection circuit configured to determine an adjustment to one or more clock phases produced by said voltage controlled delay loop based on said uncompensated clock phase adjustment values and said one or more compensation terms.

10. The clock and data recovery system of claim 9, wherein said non-ideal delay is determined from one or more measured clock times.

11. The clock and data recovery system of claim 10, wherein said measured clock times are recorded in a table.

12. The clock and data recovery system of claim 11, wherein said table indicates said measured clock times for said plurality of delay elements and for a plurality of interpolator tap settings for each of said delay elements.

13. The clock and data recovery system of claim 10, wherein said measured clock times are recorded in a plurality of tables, each of said tables associated with a different injection point in said voltage controlled delay loop.

14. The clock and data recovery system of claim 9, wherein said one or more compensation terms are subtracted from said uncompensated clock phase adjustment values to generate said adjustment to said one or more clock phases.

15. The clock and data recovery system of claim 9, wherein said adjustment to said one or more clock phases adjusts a phase of a reference clock in said voltage controlled delay loop to produce one or more recovered clocks.

16. The clock and data recovery system of claim 9, wherein one of said compensation terms is set to a predefined value when a timing error at a given point exceeds a predefined threshold.

17. A communications receiver, comprising:
a clock and data recovery system having a voltage controlled delay loop comprised of a plurality of delay elements, comprising:
a phase detector configured to evaluate a phase of data recovered from an input signal;
a digital loop filter configured to generate one or more uncompensated clock phase adjustment values based on said phase evaluation;
a clock error compensation circuit configured to generate one or more compensation terms that compensate for a non-ideal delay for one or more of said delay elements; and
a phase selection circuit configured to determine an adjustment to one or more clock phases produced by said voltage controlled delay loop based on said uncompensated clock phase adjustment values and said one or more compensation terms.

18. The communications receiver of claim 17, wherein said non-ideal delay is determined from one or more measured clock times.

19. The communications receiver of claim 18, wherein said measured clock times are recorded in a table.

20. The communications receiver of claim 19, wherein said table indicates said measured clock times for said plurality of delay elements and for a plurality of interpolator tap settings for each of said delay elements.

* * * * *